(12) United States Patent
Motoyama et al.

(10) Patent No.: US 11,664,271 B2
(45) Date of Patent: May 30, 2023

(54) DUAL DAMASCENE WITH SHORT LINER

(71) Applicant: INTERNATIONAL BUSINESS MACHINES CORPORATION, Armonk, NY (US)

(72) Inventors: Koichi Motoyama, Clifton Park, NY (US); Oscar van der Straten, Guilderland Center, NY (US); Joseph F. Maniscalco, Lake Katrine, NY (US); Alexander Reznicek, Troy, NY (US); Raghuveer Reddy Patlolla, Guilderland, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 16/401,180

(22) Filed: May 2, 2019

(65) Prior Publication Data
US 2020/0350201 A1    Nov. 5, 2020

(51) Int. Cl.
*H01L 21/768* (2006.01)
*H01L 23/522* (2006.01)
*H01L 23/532* (2006.01)

(52) U.S. Cl.
CPC .. *H01L 21/76807* (2013.01); *H01L 21/76831* (2013.01); *H01L 21/76882* (2013.01); *H01L 23/5226* (2013.01); *H01L 23/53228* (2013.01)

(58) Field of Classification Search
CPC ......... H01L 21/76807; H01L 21/76831; H01L 21/76882; H01L 23/5226; H01L 23/53228
See application file for complete search history.

(56) References Cited

U.S. PATENT DOCUMENTS

| | | | |
|---|---|---|---|
| 5,654,232 A | 8/1997 | Gardner | |
| 5,939,788 A | 8/1999 | McTeer | |
| 6,207,222 B1 | 3/2001 | Chen et al. | |
| 7,157,795 B1 * | 1/2007 | Erb | H01L 21/76849 438/653 |
| 7,498,242 B2 | 3/2009 | Kumar et al. | |
| 8,927,421 B2 | 1/2015 | Edelstein et al. | |
| 9,123,706 B2 | 9/2015 | Zierath et al. | |
| 9,406,558 B2 | 8/2016 | Ishizaka et al. | |
| 10,109,586 B2 | 10/2018 | Murray et al. | |
| 2002/0164544 A1 * | 11/2002 | Luckanc | H01L 21/76807 430/311 |
| 2006/0289999 A1 * | 12/2006 | Lee | H01L 21/76883 257/E21.585 |
| 2009/0169760 A1 | 7/2009 | Akolkar et al. | |
| 2013/0270703 A1 * | 10/2013 | Zierath | H01L 21/76879 257/751 |
| 2014/0202746 A1 * | 7/2014 | Anderson | H05K 1/11 216/13 |

* cited by examiner

*Primary Examiner* — Peter Bradford
(74) *Attorney, Agent, or Firm* — L. Jeffrey Kelly (57) ABSTRACT

A method including forming a dual damascene interconnect structure comprising a metal wire above a via, recessing the metal wire to form a trench, depositing a liner along a bottom and a sidewall of the trench, and forming a new metal wire in the trench. The method may also include forming a dual damascene interconnect structure comprising a metal wire above a via, recessing the metal wire to form a trench, depositing a liner along a bottom and a sidewall of the trench, removing the liner along the bottom of the trench, and forming a new metal wire in the trench.

14 Claims, 6 Drawing Sheets

DUAL DAMASCENE WITH SHORT LINER

BACKGROUND

The present invention relates generally to semiconductors, and more particularly, to a copper fill process for back-end-of-line trench and via.

Semiconductor devices are used in many electronic and other applications.

Semiconductor devices comprise integrated circuits that are formed on semiconductor wafers by depositing many types of thin films of material over the semiconductor wafers, and patterning the thin films of material to form the integrated circuits.

Metallization layers are usually the top-most layers of a semiconductor device. The manufacturing of semiconductor devices is typically classified into two phases, the front end of line (FEOL) and the back end of line (BEOL). The BEOL is typically considered to be the point of the manufacturing process where metallization layers are formed, and FEOL is considered to include the manufacturing processes prior to the formation of metallization layers, and where active devices are formed.

While some integrated circuits have a single top layer of metallization, other integrated circuits comprise multi-level interconnects, wherein two or more metallization layers are formed over a semiconductor wafer or workpiece. Each metallization layer typically comprises a plurality of metal lines separated from one another by an insulating material. The metal lines in immediately neighboring horizontal metallization layers may be connected vertically in predetermined places by vias formed between the metal lines.

SUMMARY

According to one embodiment of the present invention, a method is provided. The method may include forming a dual damascene interconnect structure comprising a metal wire above a via, recessing the metal wire to form a trench, depositing a liner along a bottom and a sidewall of the trench, and forming a new metal wire in the trench.

According to another embodiment of the present invention, a method is provided. The method may include forming a dual damascene interconnect structure comprising a metal wire above a via, recessing the metal wire to form a trench, depositing a liner along a bottom and a sidewall of the trench, removing the liner along the bottom of the trench, and forming a new metal wire in the trench.

According to another exemplary embodiment of the present invention, a structure is provided. The structure may include a metal wire, a via below and in electrical contact with the metal wire, and a liner positioned along vertical sidewalls of the metal wire, wherein a height of the liner is less than a height of the metal wire. The structure may also include a barrier layer positioned along a bottom and the vertical sidewalls of the metal wire, wherein a lower portion of the metal wire contacts the barrier, and wherein the liner separates an upper portion of the metal wire from the barrier layer.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention generally relate to semiconductor device manufacturing, and more particularly to a copper metallization fill process for BEOL interconnect such as a trench or a via. Typically, copper metallization may be accomplished using a dry deposition or a wet electroplating process. During the wet electroplating process, the copper that is used to fill the trench and the via opening may contain many additives. These additives may become trapped inside the electroplated copper. Chemical mechanical planarization (CMP) process may be used to remove the additives trapped inside the copper. However, once the additives are removed, they may leave behind voids. These voids may be small openings or defects within the copper layer.

Copper metallization may also be done by a dry deposition process, for example a physical vapor deposition (PVD) process. During the PVD process, copper can be vaporized and then deposited on the surface of the wafer, often in a trench, a via opening, or both. However, due to the geometry and the size of the trench or the via opening (24 nm critical dimension and beyond), the PVD process may fill the via opening and the trench with copper but not the area right above the via. As a result, the area right above the via may have a void. These voids, created by both the PVD and the wet electroplating processes, may have a negative impact on the quality of the connections created through the interconnects having the voids.

Embodiments of the present invention provide a solution to prevent or eliminate the voids created during metallization. Embodiments of the present invention illustrate a unified metallization process for BEOL interconnect structures such as a trench or a via. The unified metallization process is used to fill a dual damascene opening with a conductive interconnect material, such as copper, without creating any voids.

Figure 1:
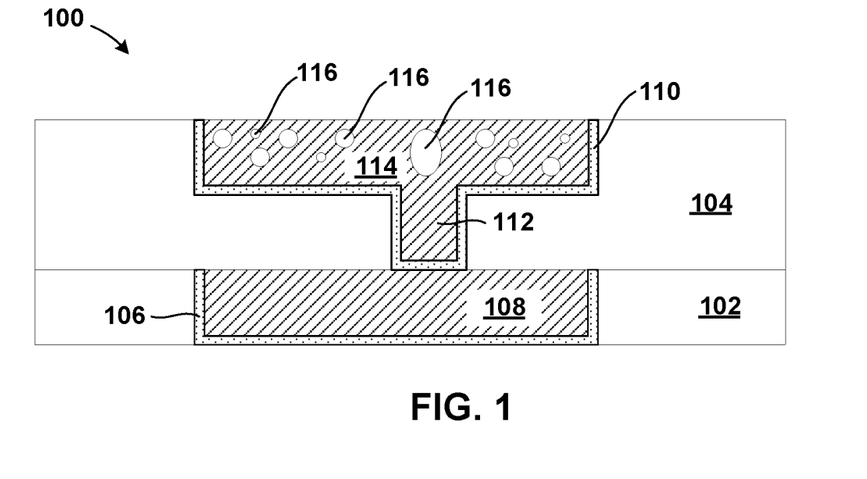
FIG. 1 is a cross section view illustrating the formation of voids in a metallization level according to an exemplary embodiment.

Referring now to FIG. 1, a structure 100 is shown, in accordance with an embodiment. The structure 100 may include a first dielectric layer 102 and a second dielectric layer 104. The first dielectric layer 102 and the second dielectric layer 104 may include any suitable dielectric material, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, or physical vapor deposition may be used to form the dielectric layers 102 and 104.

The first dielectric layer 102 may include a first barrier layer 106 and a lower metal wire 108. The lower metal wire 108 may be formed by first patterning a trench into the first dielectric layer 102, lining the trench with the first barrier layer 106, and filling the trench with a conductive interconnect material such as copper. Other conductive interconnect materials such as aluminum, or tungsten, and the like, may also be used. Filling the trench can be done by any known filling technique such as electroplating, electroless plating, chemical vapor deposition, physical vapor deposition, or a combination of methods.

A seed layer (not shown) may first be deposited within the trench in instances where a plating technique is used to form the lower metal wire 108. The seed layer may include any suitable conductive interconnect material similar to that used in the formation of the lower metal wire 108.

With continued reference to FIG. 1, the first barrier layer 106 separates the conductive interconnect material of the lower metal wire 108 from the first dielectric layer 102. The first barrier layer 106 may be formed by any suitable barrier material known in the art, for example tantalum or a tantalum-based liner material such as tantalum nitride, cobalt, or ruthenium either alone or in combination with any other suitable barrier material.

The second dielectric layer 104 may include a second barrier layer 110, a via 112, and an upper metal wire 114. The second barrier layer 110 can be made from substantially the same barrier material as the first barrier layer 106. The via 112 and the upper metal wire 114 can be formed by patterning and etching the second dielectric layer 104 to form a dual damascene opening. The dual damascene opening typically includes a wire opening and a via opening. The wire opening and the via opening in the second dielectric layer 104 may then be lined with the second barrier layer 110 and filled with copper. Other conductive interconnect materials such as aluminum or tungsten, and the like may also be used to fill the wire opening and the via opening. Once the wire opening and the via opening is filled with the conductive interconnect material, a dual damascene interconnect structure includes the upper metal wire 114 above the via 112.

Conventional deposition processes, such as electroplating, electroless plating, chemical vapor deposition, physical vapor deposition, or a combination of methods, can be used to deposit copper, or other conductive interconnect materials, into the wire opening and via opening. When these conventional deposition processes are used to deposit copper into the wire opening and via opening formed in the upper metal wire 114, voids 116 may be formed. The voids 116 may be of different shapes and sizes and may be dispersed throughout the upper metal wire 114 as well as along the sidewalls of the upper metal wire 114. In some embodiment, the voids 116 may congregate directly above the via 112. The voids 116 pose reliability issues with respect to the upper metal wire 114 and thus eliminating the void 116 will improve reliability.

Figure 2:
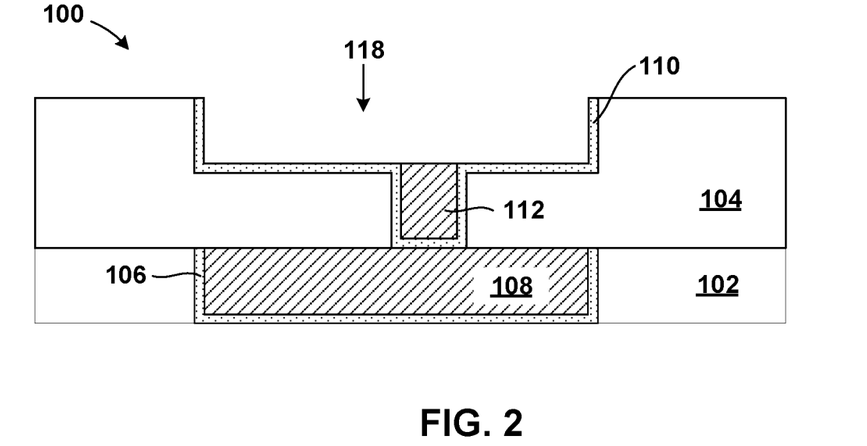
FIG. 2 is a cross section view illustrating the removal of a conductive interconnect material from a trench according to an exemplary embodiment.

Referring now to FIG. 2, the structure 100 is shown after substantially all of the conductive interconnect material of the upper metal wire 114 is recessed or removed. In an embodiment of the invention, a CMP process may first be applied to remove excess conductive interconnect material remaining on top surfaces of the structure 100. Next, a wet etch process may be used to remove the conductive interconnect material of the upper metal wire 114.

As shown in FIG. 2, substantially all of the conductive interconnect material of the upper metal wire 114 is removed, thereby exposing a bottom surface of a trench 118.

In most embodiments, the via 112 remains intact. For example, the conductive interconnect material is substantially removed in its entirety without removing any of the conductive interconnect material of the via 112. As a result, the removal of the conductive interconnect material may expose the second barrier layer 110 along both the sidewalls and bottom of the trench 118.

Removing the conductive interconnect material of the upper metal wire 114 will preferably remove the voids 116 that were dispersed throughout the upper metal wire 114. The CMP process can be used to remove excess conductive interconnect material remaining on top surfaces of the structure 100, and the etch process can be used to remove the conductive interconnect material of the upper metal wire 114.

Figure 3:
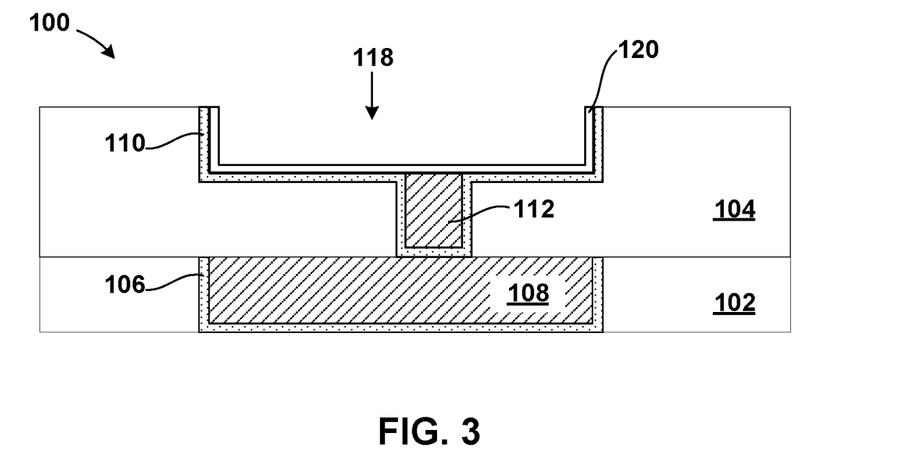
FIG. 3 is a cross section view illustrating the formation of a liner according to an exemplary embodiment.

Referring now to FIG. 3, once the conductive interconnect material of the upper metal wire 114 is removed, a liner 120 may be conformally deposited along the sidewalls and bottom of the trench 118. The liner 120 may be different from the first barrier layer 106 and the second barrier layer 110. Both, the first barrier layer 106 and the second barrier 110 act as barriers, preventing the dielectric material from migrating to either the lower metal wire 108, the via 112, or the trench 118. The liner 120, however, can be referred to as a seed enhancement layer because the liner 120 allows for better subsequent filling of the trench 118 with a new conductive interconnect material. The liner 120 can be made of metals such as ruthenium, cobalt, or any other metal suitable to act as an enhancement layer.

Using the CMP and etch processes to remove the interconnect material of the upper metal wire 114 can leave the second barrier layer 110 in a state not amenable to subsequent deposition of copper. As such, the liner 120 is deposited onto the second barrier layer 110 along the sidewalls and bottom of the trench 118. The liner 120 allows for better filling of the trench 118 with the conductive interconnect material to form a new metal wire.

Figure 4:
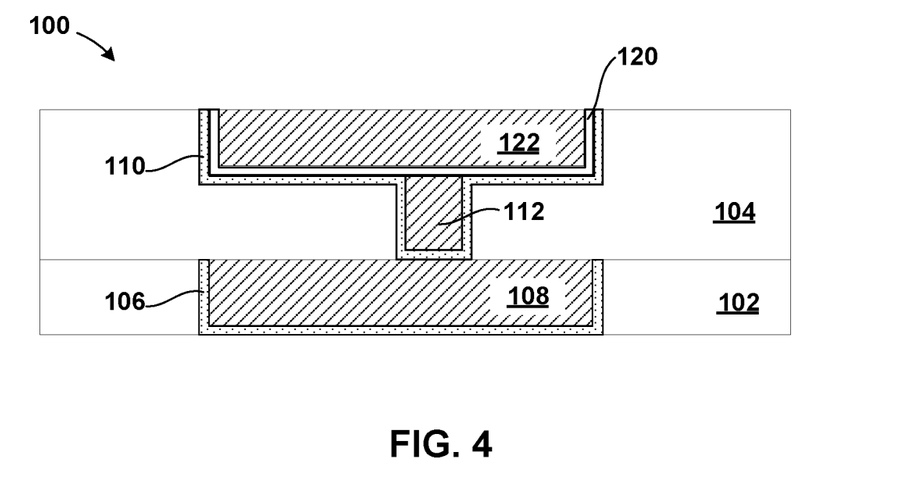
FIG. 4 is a cross section view illustrating the formation of an upper metal wire on top of the liner according to an exemplary embodiment.

Referring now to FIG. 4, after the liner 120 is deposited in the trench 118, the trench 118 is filled with a new conductive interconnect material to form a new upper metal wire 122. In an embodiment, the trench 118 may be filled with copper using a copper reflow process. In an embodiment, the copper reflow process includes depositing copper in the trench 118 and on the surface of the structure 100 at elevated temperatures while under a vacuum for a period of time. The elevated temperature allows the copper to flow to all parts of the trench thus producing a void free new upper metal wire 122.

Once the trench 118 is filled with the new conductive interconnect material, the structure 100 may undergo an annealing process followed by a final CMP process. The annealing process is a heat treatment process that can alter the physical and chemical properties of the new conductive interconnect material, making the new conductive interconnect material more ductile. The final CMP process removes excess new conductive interconnect material, such as copper, from the top of the structure 100 that was deposited during the copper reflow process. The second dielectric layer 104 of the final structure 100, illustrated in FIG. 4, includes the second barrier layer 110, lining the via 112 and the new upper metal wire 122, and the liner 120 lining the sidewalls and bottom of the new upper metal wire 122. Further, as illustrated in FIG. 4, the new upper metal wire 122 is void free.

Another embodiment by which to use a unified metallization fill process for back-end-of-line trench and via is described in detail below by referring to the accompanying drawings FIGS. 5-6.

Figure 5:
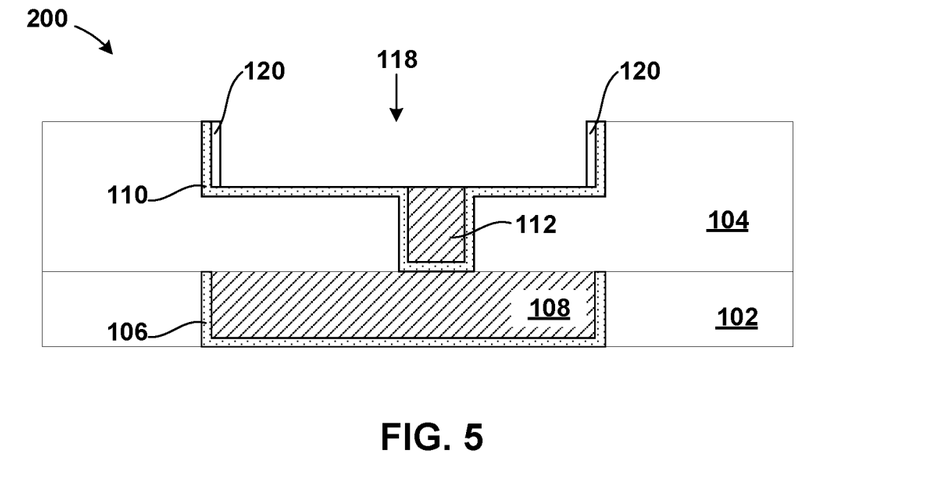
FIG. 5 is a cross section view illustrating the formation of a liner on the sidewalls of the trench according to another exemplary embodiment.

Referring now to FIG. 5, a structure 200 is shown according to another embodiment of the invention. The structure 200 may be substantially similar in all respects to the structure 100 described in detail above; however, in the present embodiment, the liner 120 is removed from the bottom of the trench 118 and remains only on the sides of the trench 118.

Beginning with the structure 100 of FIG. 3, a physical etch process is applied to the bottom of the trench 118 to remove the liner 120 that is lined directly above the second barrier layer 110. The physical etch process removes the liner 120 from the bottom of the trench 118 without removing the liner 120 from the sidewalls of the trench 118, as illustrated in FIG. 5. As a result, the liner 120 remains only on the sidewalls of the trench 118. Having the liner 120 at the sidewalls of the trench 118 can improve the filling of the trench 118 with the new conductive interconnect material. For example, the liner 120 can enhance the copper reflow process it allows for the copper reflow to occur in situ, on a liner which has not been air exposed or oxidized. It should be noted that having the liner 120 deposited onto the sidewalls of the trench 118 is more beneficial than not having the liner 120 at all because the liner 120, even at the sidewalls of the trench 118, enhances the re-filling of the trench 118, as described above. In addition, removing the liner 120 from the bottom of the trench 118 decreases the resistance between the via 112 and the new conductive interconnect material.

Figure 6:
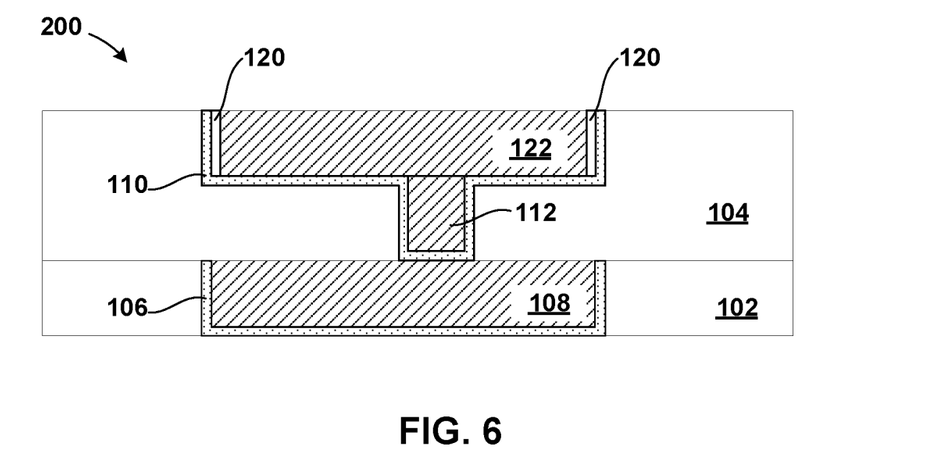
FIG. 6 is a cross section view illustrating the formation of an upper metal wire according to an exemplary embodiment.

Referring now to FIG. 6, after the liner 120 is removed from the bottom surface of the trench 118, the trench 118 is refilled with the new conductive interconnect material, such as copper, using the copper reflow process. The structure 200 then undergoes an annealing process, described herein with reference to FIG. 4, followed by the final CMP process.

The final structure 200, illustrated in FIG. 6, includes the first and second dielectric layers 102 and 104. The first dielectric layer 102 includes the lower metal wire 108 lined with the first barrier layer 106. The second dielectric layer 104 includes the via 112 and the new upper metal wire 122. Both the via 112 and the new upper metal wire 122 include the second barrier layer 110. The sidewalls of the new upper metal wire 122 include the additional liner 120.

Another embodiment by which to use a unified copper metallization fill process for back-end-of-line trench and via is described in detail below by referring to the accompanying drawings FIGS. 7-9.

Figure 7:
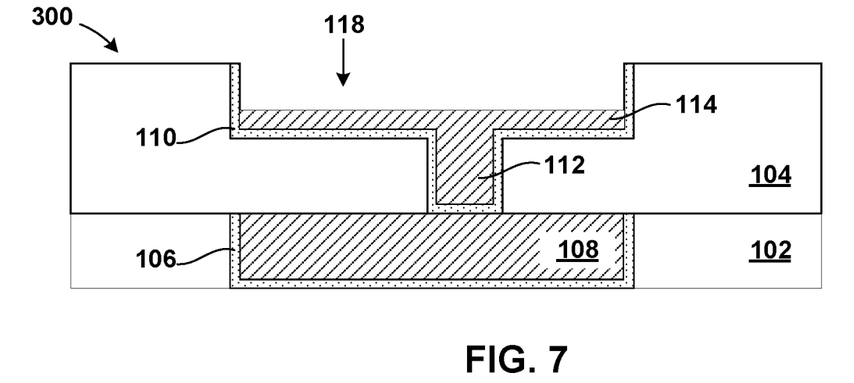
FIG. 7 is a cross section view illustrating the partial removal of a conductive interconnect material from a trench according to another exemplary embodiment.

Referring now to FIG. 7, a structure 300 is shown according to another embodiment of the invention. The structure 300 may be substantially similar in all respects to structures 100 and 200, described in detail above; however, in the present embodiment, only a portion of the conductive interconnect material of the upper metal wire 114 is removed.

Beginning with the structure 100 of FIG. 1, only a portion of the conductive interconnect material of the upper metal wire 114 is removed. The resulting structure 300 is illustrated in FIG. 7. As described above with reference to FIG. 2, the CMP process is used to polish excess conductive interconnect material from the upper metal wire 114, and the etch process is used to only remove a portion of the conductive interconnect material of the upper metal wire 114. The etch process removes the portion of the conductive interconnect material of the upper metal wire 114 that contains the voids 116 such that the remaining portion of the upper metal wire 114 is void free. The etch process partially recesses the metal wire to a depth that is less than a height of the upper metal wire 114. As a result, the structure 300, as illustrated in FIG. 7, includes the first dielectric layer 102, the first barrier layer 106, and the lower metal wire 108. The structure 300 also includes the second dielectric layer 104, the second barrier layer 110, the via 112, and the remaining portion of the upper metal wire 114. The second barrier layer 110 lines the via 112, the bottom and sidewalls of the upper metal wire 114 as well as the sidewalls of the trench 118.

It should be noted that removing substantially all of the conductive interconnect material of the upper metal wire 114, as illustrated in FIG. 2, exposes the second barrier layer 110 to air. This allows for the second barrier layer 110 to oxidize and reduce the copper reflow efficiency. However, removing only a portion of the conductive interconnect material of the upper metal wire 114, as illustrated in FIG. 7, removes the voids 116 without exposing the second barrier layer 110 to air.

Figure 8:
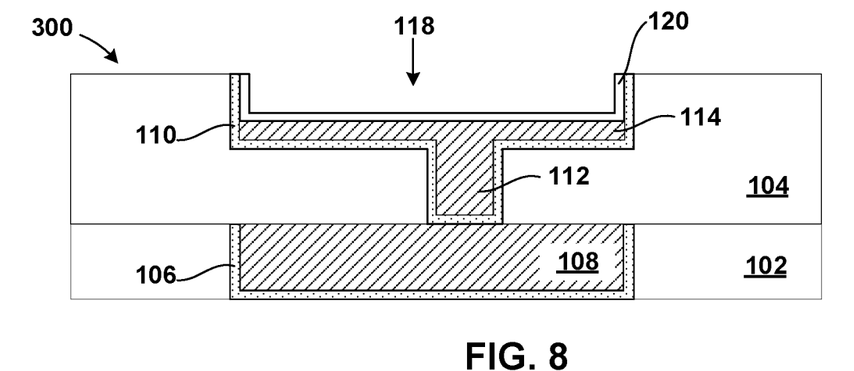
FIG. 8 is a cross section view illustrating the formation of a liner in direct contact with the conductive interconnect material partially filling the upper metal wire according to an exemplary embodiment.

Referring now to FIG. 8, the remaining conductive interconnect material within the trench 118 and the exposed sidewalls of the trench 118 are lined with the liner 120. The liner 120 acts as the seed enhancement layer for the subsequent filing of the trench 118 with the new conductive interconnect material. In an embodiment, a top of the upper metal wire 114 is in direct contact with the liner 120. The liner 120 spans throughout the bottom and the sidewalls of the trench 118. The second dielectric layer 104 of the resulting structure 300, as illustrated in FIG. 8, includes the second barrier layer 110, the via 112, the remaining portion of the upper metal wire 114, the trench 118, and the liner 120.

Figure 9:
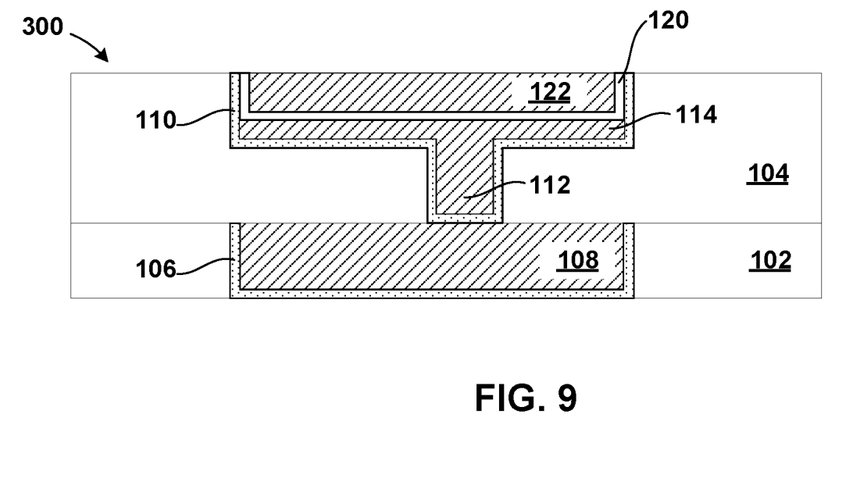
FIG. 9 is a cross section view illustrating the formation of the upper metal wire in direct contact with the liner according to an exemplary embodiment.

Referring now to FIG. 9, the structure 300 with the liner 120 deposited onto the sidewalls and the bottom of the trench 118 is re-filled with the new conductive interconnect material of the new upper metal wire 122. The remaining portion of 114 and the new upper metal wire 122 can be collectively referred to as a new upper metal line. In an embodiment, a copper reflow process can be used to fill the trench 118 with copper. After the trench 118 is refilled with the new conductive interconnect material, the structure 300 can go through an anneal process, followed by a final CMP process.

The final structure 300, illustrated in FIG. 9, includes the first dielectric layer 102 and the second dielectric layer 104. The first dielectric layer 102 includes the first barrier layer 106 and the lower metal wire 108. The second dielectric layer 104 includes the second barrier layer 110, the via 112, the portion of the upper metal wire 114, the liner 120, and the new upper metal wire 122. It should be noted that having the liner 120 deposited onto the sidewalls and the bottom of the trench 118 is more beneficial than not having the liner 120 at all because the liner 120 enhances the re-filling of the trench 118. In addition, having the liner 120 at the sidewalls and the bottom of the trench 118 does not increase resistance between the via 112 and the new conductive interconnect material because the liner 120 is not directly above the via 112. Rather, the remaining portion of the upper metal wire 114 separates the via 112 from the liner 120 and reduces the resistance between the via 112 and the new upper metal wire 122. The liner 120 separates an upper portion of the new upper metal wire 122 from a lower portion of the remaining upper metal wire 114.

Another embodiment by which to use a unified copper metallization fill process for back-end-of-line trench and via is described in detail below by referring to the accompanying drawings FIGS. 10-11.

Figure 10:
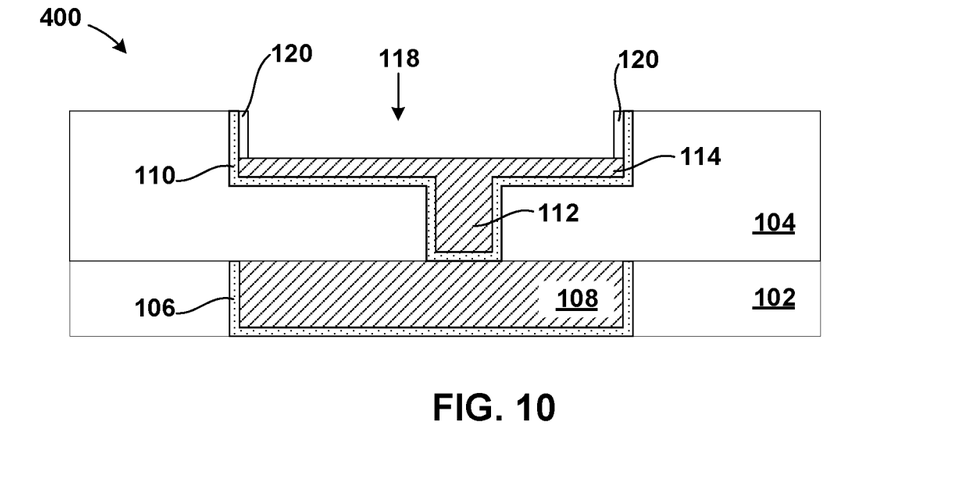
FIG. 10 is a cross section view illustrating the formation of a liner on the sidewall of the trench according to another exemplary embodiment.

Referring now to FIG. 10, a structure 400 is shown according to yet another embodiment of the invention. The structure 400 may be substantially similar in all respects to structures 100, 200, and 300, described in detail above; however, in the present embodiment, only a portion of the conductive interconnect material may be removed from the upper metal wire 114 and the sidewalls of the trench 118 may be lined with the liner 120.

Beginning with the structure 300 of FIG. 7, once a portion of the conductive interconnect material of the upper metal wire 114 is removed, the sidewalls and the bottom of the trench 118 are lined with the liner 120. A physical etch process is applied only to the bottom of the trench 118 to remove that liner 120 from the bottom. The resulting structure 400, illustrated in FIG. 10, includes the first and second dielectric layers 102 and 104. The second dielectric layer 104 includes the second barrier layer 110, the via 112, the remaining portion of the upper metal wire 114, and the liner 120 only lining the sidewalls of the trench 118.

Figure 11:
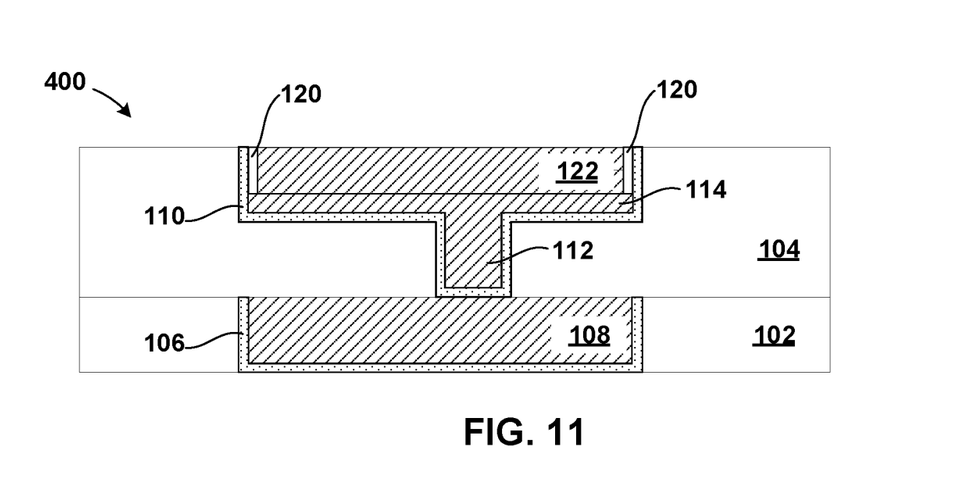
FIG. 11 is a cross section view illustrating the formation of the upper metal wire in direct contact with the liner according to an exemplary embodiment.

Referring now to FIG. 11, after a bottom portion of the liner 120 is removed, the reflow process is used to fill the trench 118 with the conductive interconnect material to form the new upper metal wire 122. After the trench 118 is refilled with the new conductive interconnect material, the structure 400 can go through an anneal process, followed by a final CMP process.

The final structure 400, illustrated in FIG. 11, includes the first dielectric layer 102 and the second dielectric layer 104. The first dielectric layer 102 includes the first barrier layer 106 and the lower metal wire 108. The second dielectric layer 104 includes the second barrier layer 110, the via 112, the portion of the upper metal wire 114, the liner 120, and the new upper metal wire 122. The remaining portion of 114 and the new upper metal wire 122 can be collectively referred to as the new upper metal line. The via 112 is below and in electrical contact with the new upper metal wire 122. The liner 120 is positioned along vertical sidewalls of the new upper metal wire 122. A height of the liner 120 is less than a height of the new upper metal wire 122.

It should be noted that the liner 120 remains only at the sidewalls of the trench 118. Further, removing the liner 120 from the bottom of the trench does not affect the reflow process due to of the presence of the remaining upper metal wire 114. Even though a portion of the conductive interconnect material of the upper metal wire 114 is removed, as illustrated in FIG. 10, the remaining upper metal wire 114 acts as a seed enhancement layer. Therefore, removing the liner 120 from the bottom of the trench 118 still allows for the reflow process to create the new upper metal wire 122 that is void free.

It should also be noted that removing the liner 120 from the bottom of the trench 118 can allow better connectivity between the via 112 and the new upper metal line. In addition, an interface between the upper metal wire 114 and the new metal wire 122 can be present. For example, when using copper as the conductive interconnect material, both copper metallization approaches can contain different levels of impurities. Specifically, during the formation of the upper metal wire 114, using a copper electroplating process, the copper that is used can contain higher levels of impurities such as sulfur and chlorine. During the second copper metallization process to create the new upper metal wire 122 using copper reflow, the copper contains lower levels of impurities such as sulfur and chlorine than the copper that is used to form the upper metal wire 114. As a result, an interface between the upper metal wire 114 and the new upper metal wire 122 can be present.

Yet another embodiment by which to use a unified copper metallization fill process for back-end-of-line trench and via is described in detail below by referring to the accompanying drawings FIGS. 12-13.

Figure 12:
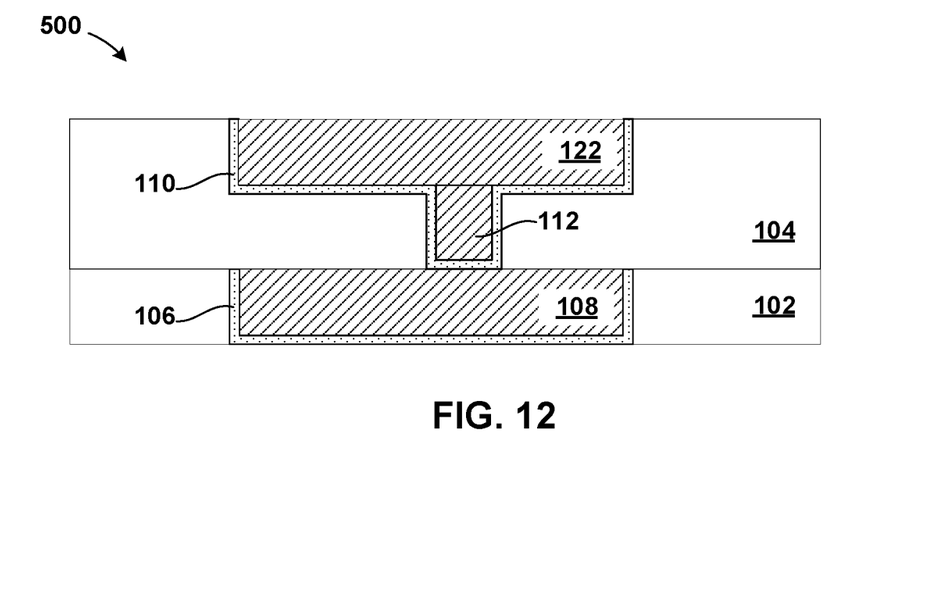
FIG. 12 is a cross section view illustrating the formation of the upper metal wire according to another exemplary embodiment.

Referring now to FIG. 12, a structure 500 is shown according to yet another embodiment of the invention. The structure 500 may be substantially similar in all respects to structure 200, illustrated in FIGS. 5-6 and described in detail above; however, in the present embodiment, the liner 120 is not present.

Beginning with the structure 100 of FIG. 2, substantially all of the conductive interconnect material of the upper metal wire 114 is removed using a combination of CMP and etch processes. Once the conductive interconnect material is removed, the trench 118 can be re-filled, using the reflow process described above, with the new conductive interconnect material without first lining the sidewalls and bottom of the trench 118 with the liner 120. As a result, the new upper metal wire 122 can have the second barrier layer 110 separating the conductive interconnect material from the second dielectric layer 104.

The final structure 500, illustrated in FIG. 12, includes the first dielectric layer 102 and the second dielectric layer 104. The first dielectric layer 102 includes the first barrier layer 106 and the lower metal wire 108. The second dielectric layer 104 includes the second barrier layer 110, the via 112, and the new upper metal wire 122. It should be noted that re-filling the trench 118 (not shown in FIG. 12) with the new conductive interconnect material without first lining the trench 118 with the liner 120 is not as advantageous as at least partially lining the trench 118 with the liner 120. Without the liner 120, the reflow of the new conductive interconnect material, such as copper, can have poor fill performance.

Figure 13:
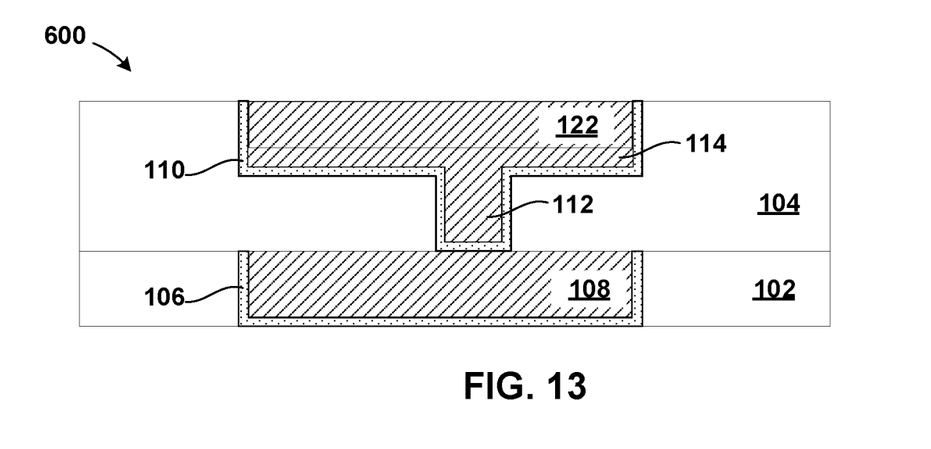
FIG. 13 is a cross section view illustrating the formation of the upper metal wire in direct contact with the conductive interconnect material partially filling the upper metal wire according to another exemplary embodiment.

Referring now to FIG. 13, a structure 600 is shown according to yet another embodiment of the invention. The structure 600 may be substantially similar in all respects to structure 300, illustrated in FIGS. 7-9 and described in detail above; however, in the present embodiment, the liner 120 is not present but a portion of the upper metal wire 114 still remains.

Beginning with the structure 300 of FIG. 7, only a portion of the conductive interconnect material of the upper metal wire 114 is removed. As described above with reference to FIG. 2, the CMP process is used to polish excess conductive interconnect material from the top of the structure 300, and the etch process is used to only remove a portion of the conductive interconnect material of the upper metal wire 114. Once only a portion of the conductive interconnect material of the upper metal wire 114 is removed, the trench 118 is refilled with the new conductive interconnect material. The trench 118 is not lined with the liner 120 before it is refilled. Rather, the remaining portion of the upper metal wire 114 acts as a seed enhancement layer, allowing for better reflow of the new conductive interconnect material.

The final structure 600, illustrated in FIG. 13, includes the first dielectric layer 102 and the second dielectric layer 104. The first dielectric layer 102 includes the first barrier layer 106 and the lower metal wire 108. The second dielectric layer 104 includes the second barrier layer 110, the via 112, the remaining portion of the upper metal wire 114, and the new upper metal wire 122. It should be noted that re-filling the trench 118 (not shown in FIG. 12) with the new conductive interconnect material, without first lining the trench 118 with the liner 120, can still be advantageous because the remaining portion of the upper metal wire 114 acts as a seed enhancement layer. The remaining portion of the upper metal wire 114 provides a surface that is amenable to the re-flow process, creating the new line that is void free.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A dual damascene structure comprising:
a first metal wire having an upper portion and a lower portion;
a via below and in electrical contact with the first metal wire;
a seed layer separating the lower portion of the first metal wire from the upper portion of the first metal wire, wherein the seed layer comprises ruthenium,
wherein the upper portion of the first metal wire comprises reflowed copper,
wherein the lower portion of the first metal wire comprises tungsten; and
a second metal wire below and in electrical contact with the via, wherein the second metal wire comprises a homogeneous structure of electroplated copper.

2. The dual damascene structure of claim 1, wherein the via and the lower portion of the first metal wire are a homogenous structure made from the same material.

3. The dual damascene structure of claim 1, wherein the lower portion of the first metal wire is free of voids.

4. The dual damascene structure of claim 1, further comprising:
a single barrier layer positioned along a bottom and vertical sidewalls of the first metal wire, wherein the lower portion of the first metal wire contacts the single barrier layer, and
wherein the seed layer separates the upper portion of the first metal wire from the single barrier layer,
wherein the single barrier layer and the seed layer each comprise different materials.

5. The dual damascene structure of claim 1, further comprising:
a first dielectric layer, the first dielectric layer includes the second metal wire; and
a second dielectric layer directly above the first dielectric layer, the second dielectric layer includes the via and the first metal wire.

6. A dual damascene structure comprising:
a first metal wire having an upper portion and a lower portion;
a via below and in electrical contact with the first metal wire;
a seed layer separating the lower portion of the first metal wire from the upper portion of the first metal wire, wherein the seed layer comprises copper only, wherein the upper portion of the first metal wire comprises reflowed copper, wherein the lower portion of the first metal wire comprises electroplated copper; and a second metal wire below and in electrical contact with the via, wherein the second metal wire comprises a homogeneous structure of electroplated copper, wherein an upper most surface of the seed layer is flush with an upper most surface of the upper portion of the first metal wire;

wherein the electroplated copper of the lower portion of the first metal wire comprises a higher level of sulfur and a higher level of chlorine than the reflowered copper of the upper portion of the first metal wire.

7. The dual damascene structure of claim 6, wherein the via and the lower portion of the first metal wire are a homogenous structure made from the same material.

8. The dual damascene structure of claim 6, wherein the lower portion of the first metal wire is free of voids.

9. The dual damascene structure of claim 6, further comprising:
  a single barrier layer positioned along a bottom and vertical sidewalls of the first metal wire, wherein the lower portion of the first metal wire contacts the single barrier layer, and wherein the seed layer separates the upper portion of the first metal wire from the single barrier layer,
  wherein the single barrier layer and the seed layer each comprise different materials.

10. The dual damascene structure of claim 6, further comprising:
  a first dielectric layer, the first dielectric layer includes the second metal wire; and
  a second dielectric layer directly above the first dielectric layer, the second dielectric layer includes the via and the first metal wire.

11. A dual damascene structure comprising:
  a first metal wire having an upper portion and a lower portion, the lower portion is entirely below the upper portion;
  a via below and in electrical contact with the first metal wire;
  a seed layer separating the lower portion of the first metal wire from the upper portion of the first metal wire, wherein the seed layer comprises copper only, wherein the upper portion of the first metal wire comprises reflowed copper,
  wherein the lower portion of the first metal wire comprises electroplated copper;
  a single barrier layer positioned along a bottom and vertical sidewalls of the first metal wire, wherein the lower portion of the first metal wire contacts the single barrier layer, and wherein the seed layer separates the upper portion of the first metal wire from the single barrier layer,
  wherein the single barrier layer and the seed layer each comprise different materials,
  wherein sidewalls of the seed layer directly contact sidewalls of the single barrier layer; and
  a second metal wire below and in electrical contact with the via, wherein the second metal wire comprises a homogeneous structure of electroplated copper.

12. The dual damascene structure of claim 11, wherein the via and the lower portion of the first metal wire are a homogenous structure made from the same material.

13. The dual damascene structure of claim 11, wherein the lower portion of the first metal wire is free of voids.

14. The dual damascene structure of claim 11, wherein an upper most surface of the seed layer is flush with an upper most surface of the upper portion of the first metal wire,
wherein the seed layer surrounds all vertical sides and a bottom of the upper portion of the first metal wire.

* * * * *